US012701971B2

(12) United States Patent
Duan et al.

(10) Patent No.: US 12,701,971 B2
(45) Date of Patent: Aug. 4, 2026

(54) SEMICONDUCTOR STRUCTURE

(71) Applicant: MediaTek Singapore Pte. Ltd.,
Singapore (SG)

(72) Inventors: Lian Duan, Singapore (SG); Zhigang Duan, Singapore (SG); Chang Liang, Singapore (SG); Jubao Zhang, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 399 days.

(21) Appl. No.: 18/405,095

(22) Filed: Jan. 5, 2024

(65) Prior Publication Data

US 2025/0226270 A1      Jul. 10, 2025

(51) Int. Cl.
*H10P 74/00*          (2026.01)

(52) U.S. Cl.
CPC .......... *H10P 74/277* (2026.01); *H10P 74/273* (2026.01)

(58) Field of Classification Search
CPC ............. H10P 54/00–924; H10P 74/20; H10P 74/207; H10P 74/203; H10P 74/27; H10P 74/277; H10P 74/273
See application file for complete search history.

(56) References Cited

U.S. PATENT DOCUMENTS

| | | | |
|---|---|---|---|
| 7,550,986 B2 * | 6/2009 | Kerber ............... | G01R 31/2884 324/762.05 |
| 8,344,745 B2 * | 1/2013 | Aghababazadeh ..... | H10P 74/23 324/762.01 |
| 8,563,359 B2 * | 10/2013 | Watanabe ............... | H10P 54/00 438/114 |
| 9,576,613 B2 * | 2/2017 | Paak ...................... | G11C 29/48 |
| 2002/0034325 A1 * | 3/2002 | Reinhorn ......... | G01N 21/95692 382/145 |
| 2003/0006795 A1 * | 1/2003 | Asayama .............. | H10P 74/277 324/750.3 |
| 2004/0069989 A1 * | 4/2004 | Wu ..................... | H10B 12/0383 257/E21.652 |

(Continued)

FOREIGN PATENT DOCUMENTS

| | | | | |
|---|---|---|---|---|
| CN | 101884102 A | * | 11/2010 | ............ H10P 74/277 |
| CN | 105336639 A | * | 2/2016 | ............ H10P 74/207 |

(Continued)

*Primary Examiner* — Evren Seven

(74) *Attorney, Agent, or Firm* — McClure, Qualey & Rodack, LLP

(57)          ABSTRACT

A semiconductor structure is provided. The semiconductor structure includes a semiconductor wafer, a test structure, and a photoresist pattern. The semiconductor wafer has a substrate with die areas separated by a scribe line area. The test structure disposed in the scribe line area includes first and second transistor test units. The photoresist pattern is arranged between the first and second transistor test units. The first gate structures of the first and second transistor test units are electrically connected to each other. The second gate structures of the first and second transistor test units are electrically connected to each other. A first drain region of the first transistor test unit is electrically connected to a first source region of the second transistor test unit. A second drain region of the first transistor test unit is electrically connected to a second source region of the second transistor test unit.

21 Claims, 6 Drawing Sheets

(56) References Cited

U.S. PATENT DOCUMENTS

| | | | | |
|---|---|---|---|---|
| 2005/0212092 A1* | 9/2005 | Nishizawa | ............. | H10P 54/00 |
| | | | | 257/622 |
| 2006/0157700 A1* | 7/2006 | Winter | ................. | H10P 74/273 |
| | | | | 438/18 |
| 2014/0045320 A1* | 2/2014 | Uchiyama | ............. | H10W 46/00 |
| | | | | 438/462 |
| 2015/0206802 A1* | 7/2015 | Roesner | ................. | H10P 54/00 |
| | | | | 257/734 |
| 2020/0168701 A1* | 5/2020 | Lin | ..................... | H10D 62/115 |
| 2022/0413038 A1* | 12/2022 | Kim | ................... | G01R 31/2884 |
| 2024/0125713 A1* | 4/2024 | Yang | ................. | G01N 21/9501 |
| 2024/0288487 A1* | 8/2024 | Zhang | ............... | G01R 31/2644 |

FOREIGN PATENT DOCUMENTS

| | | | | | | |
|---|---|---|---|---|---|---|
| CN | 114300444 A | * | 4/2022 | | | |
| DE | 102005003000 A1 | * | 8/2006 | ........... | H10P 74/277 |
| JP | 2006013291 A | * | 1/2006 | | | |

* cited by examiner

SEMICONDUCTOR STRUCTURE

BACKGROUND OF THE INVENTION

Field of the Invention

The present invention relates to a semiconductor structure, and, in particular, to a test structure disposed in the scribe line area of a semiconductor wafer.

Description of the Related Art

During the process of manufacturing an integrated circuit (IC), IC dies are formed on a single semiconductor wafer. The integrated circuit dies are arranged in an array with scribe line areas between them. These scribe line areas are provided for the placement of test keys, to test different properties of the semiconductor wafer so as to maintain and ensure device quality. After the integrated circuit dies are manufactured on the semiconductor wafer, the integrated circuit dies are separated along the scribe line areas using a singulation process to make them ready for the subsequent packaging processes.

Thus, an appropriate test key structure for monitoring the finished product is needed.

BRIEF SUMMARY OF THE INVENTION

An embodiment of the present invention provides a semiconductor structure. The semiconductor structure includes a semiconductor wafer, a test structure, and a photoresist pattern. The semiconductor wafer has a substrate having a scribe line area and die areas. The die areas are separated by the scribe line area. The test structure is disposed in the scribe line area. The test structure includes a first transistor test unit and a second transistor test unit disposed on the substrate and arranged side by side along a first direction. The first transistor test unit and the second transistor test unit each includes a first gate structure, a second gate structure, a first source region, a first drain region, a second source region and a second drain region. The first gate structure and a second gate structure are arranged sequentially in the first direction and extending along a second direction. The first source region and the first drain region are disposed on opposite sides of the first gate structure. The second source region and a second drain region are disposed on opposite sides of the second gate structure. The photoresist pattern is arranged between the second gate structure of the first transistor test unit and the first gate structure of the second transistor test unit and extending along the second direction. The first gate structure of the first transistor test unit is electrically connected to the first gate structure of the second transistor test unit. The second gate structure of the first transistor test unit is electrically connected to the second gate structure of the second transistor test unit. The first drain region of the first transistor test unit is electrically connected to the first source region of the second transistor test unit. The second drain region of the first transistor test unit is electrically connected to the second source region of the second transistor test unit.

An embodiment of the present invention provides a semiconductor structure. The semiconductor structure includes a semiconductor wafer, a test structure, and a photoresist pattern. The semiconductor wafer has a substrate having a scribe line area and die areas. The die areas are separated by the scribe line area. The test structure is disposed in the scribe line area. The test structure includes a first transistor test unit and a second transistor test unit disposed on the substrate along a first direction and connected in series. The first transistor test unit and the second transistor test unit each includes a first transistor test device and a second transistor test device arranged sequentially in the first direction, wherein a first drain region of the first transistor test device is used as a second source region of the second transistor test device. The photoresist pattern has opposite edges that are respectively adjacent to a second drain region of the second transistor test device of the first transistor test unit and a first source region of the first transistor test device of the second transistor test unit. A first sum of a first dimension of the first source region of the second transistor test unit and a second dimension of the second drain region of the first transistor test unit along the first direction is equal to a second sum of a third dimension of the second source region of the first transistor test unit and a fourth dimension of the first drain region of the second transistor test unit along the first direction.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Since the size of semiconductor devices has been continuously shrinking, resulting in smaller semiconductor chip size and increased device density. One of the limiting factors in the continuing evolution toward smaller device size and higher density has been the stringent requirements placed on photolithography processes as line width and space have decreased for device features. For example, the photoresist residue on source/drain regions of transistors during the source/drain implantation process is difficult to detect with automatic visual inspection. However, the manual visual inspection for the photoresist residue cannot meet the needs of current industrial production. In addition, there is no testkey in the scribe line areas for wafer acceptance test (WAT) of electrical performances to identify the photoresist residue during the source/drain implantation process. Therefore, a novel test key structure to monitor the photoresist residue on the source/drain regions in the die areas is needed.

Figure 2:
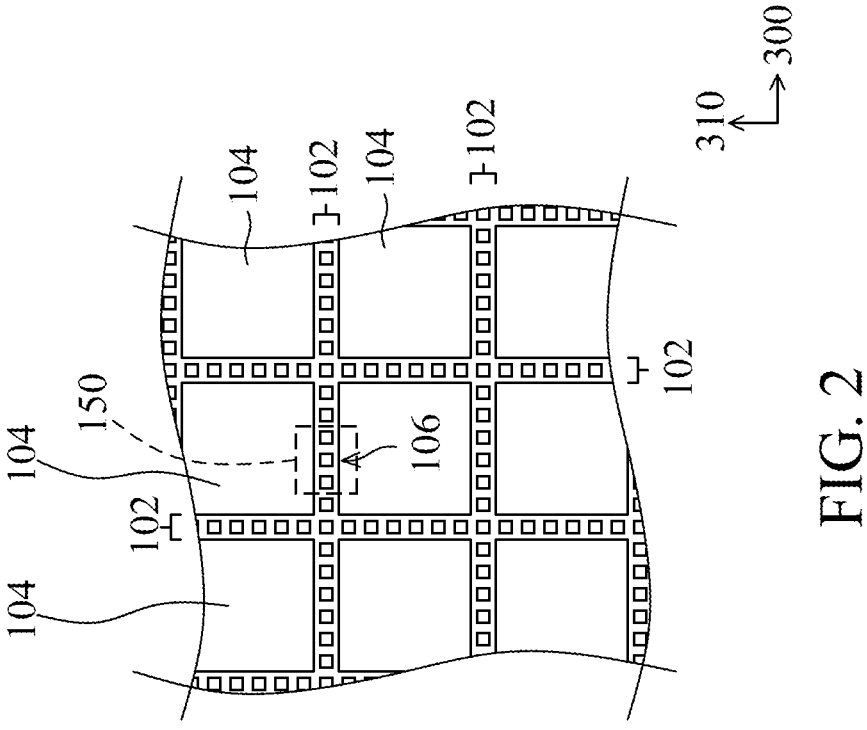
FIG. 2 is an enlarged top view of the FIG. 1, showing the arrangement of scribe line areas and die areas.
Figure 1:
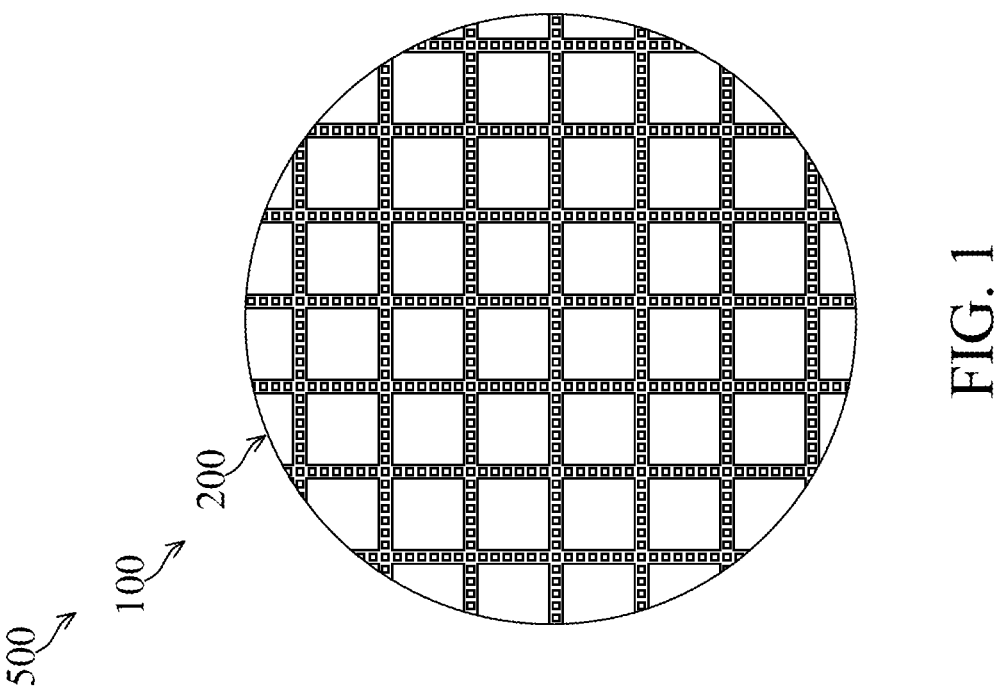
FIG. 1 is a schematic top view of a semiconductor wafer in accordance with some embodiments of the disclosure.

FIG. 1 is a schematic top view of a semiconductor wafer 100 of a semiconductor structure 500 in accordance with some embodiments of the disclosure. FIG. 2 is an enlarged top view of the FIG. 1, showing the arrangement of scribe line areas 102 and die areas 104. As shown in FIGS. 1-2, the semiconductor wafer 100 has a substrate 200 (would be described in FIGS. 4, 6 and 7) having scribe line areas 102 and die areas 104. The adjacent die areas 104 are separated by the scribe line areas 102. In some embodiment, the scribe line areas 102 are defined on the substrate 200 and extend along different directions 300 and 310. In addition, the direction 300 may be substantially perpendicular to the direction 310. In some embodiments, the substrate 200 may comprise silicon. In alternative embodiments, SiGe, bulk semiconductor, strained semiconductor, compound semiconductor, semiconductor-on-insulator (SOI), and other commonly used semiconductor substrates can be used for the substrate 200. In some embodiment, the substrate 200 may have a first conductivity type such as P-type, or a second conductivity type such as N-type, depending on requirements.

In some embodiment, the scribe line areas 102 are used to separate die areas 104 and provided spaces for the singulation process (including sawing, laser grooving or other applicable singulation processes) to cut the semiconductor wafer 100 into individual semiconductor dies (i.e., the separated die areas 104) without damaging the semiconductor dies. In some embodiment, the scribe line areas 102 are also provided spaces for one or more test structures 106 disposed therein without occupying the space for the die areas 104. In addition, the test structures 106 may be removed after the semiconductor wafer 100 is subjected the singulation process.

Figure 3:
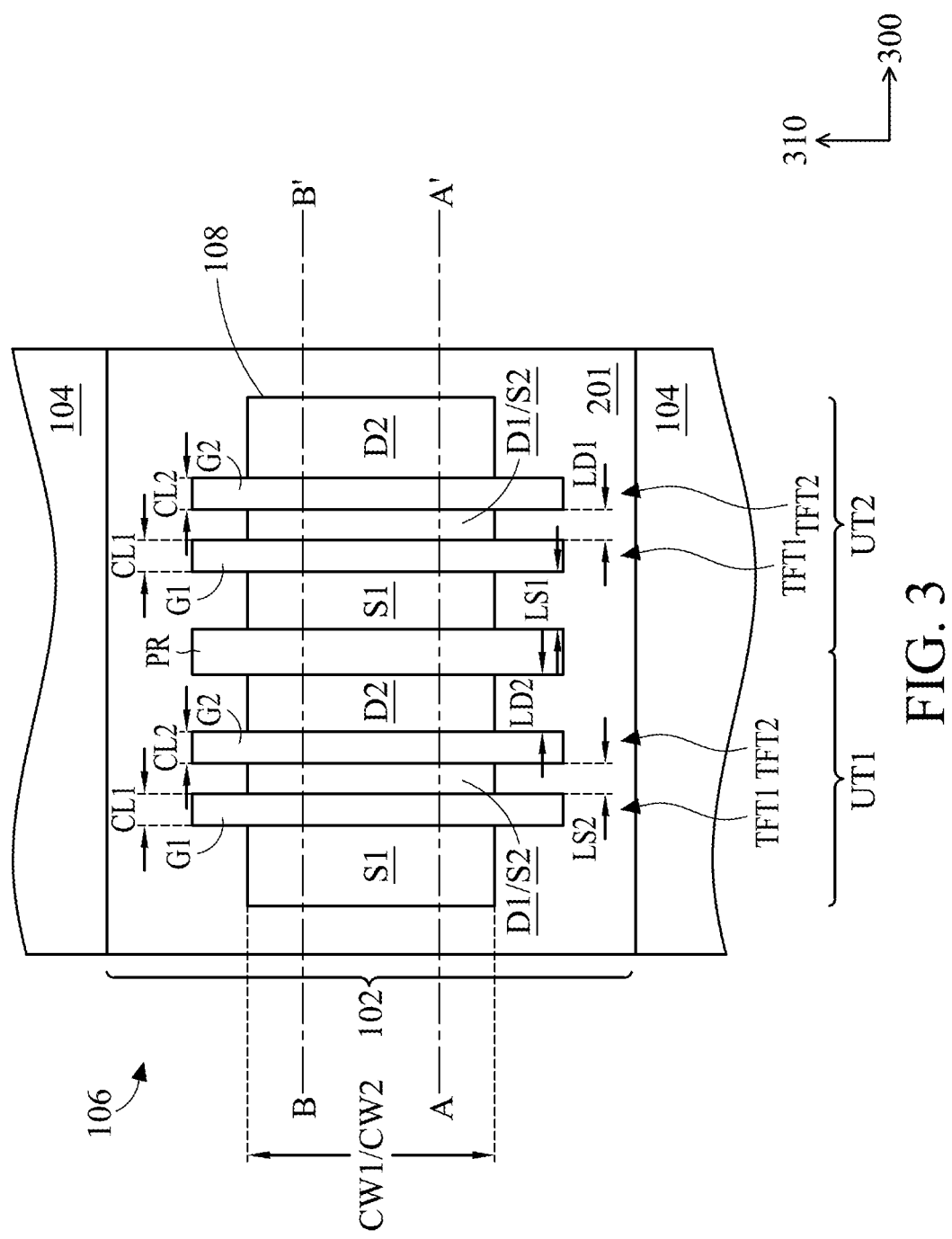
FIG. 3 is an enlarged top view of the FIG. 2, showing the arrangement of test structures in accordance with some embodiments of the disclosure.
Figure 4:
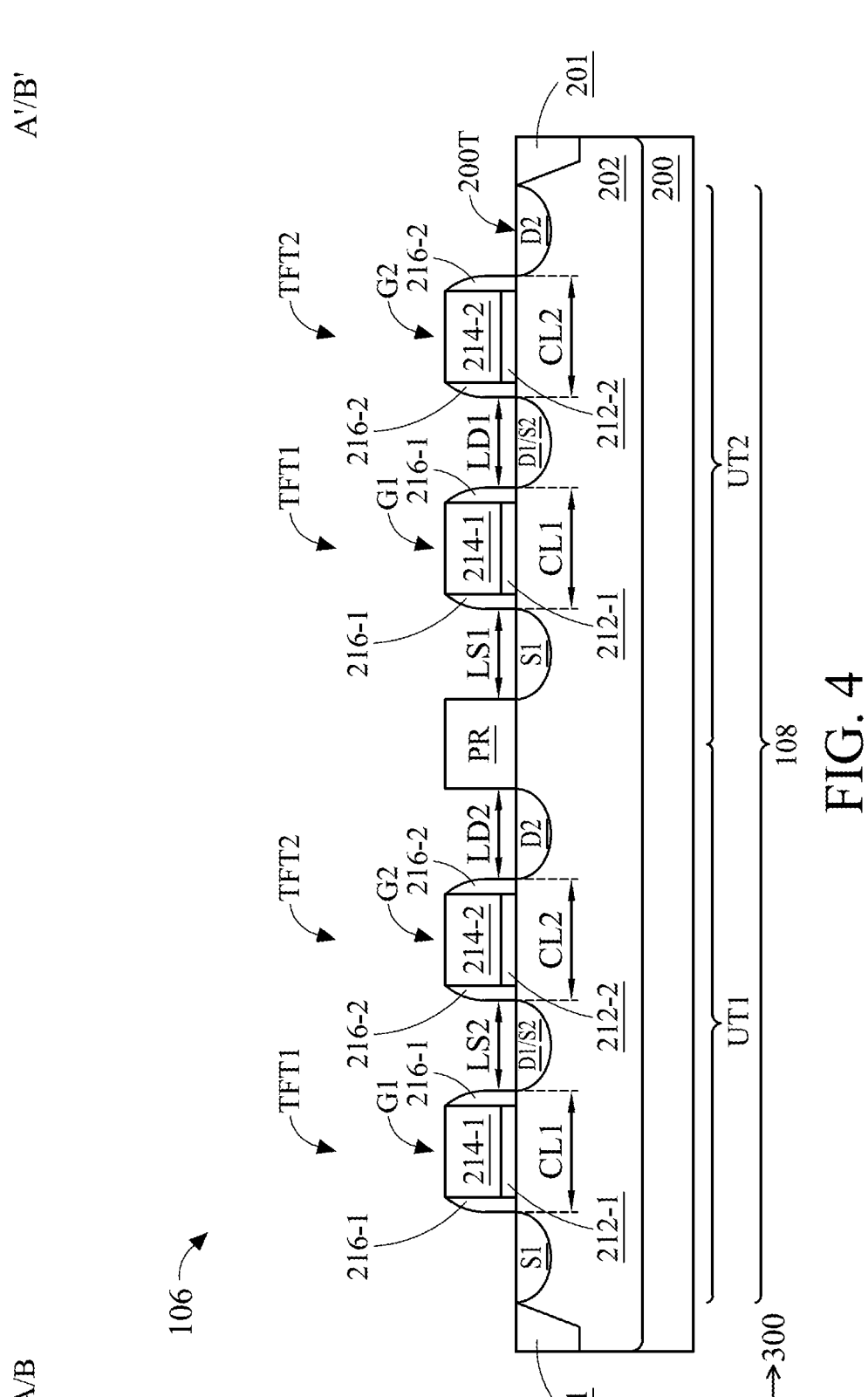
FIG. 4 is a cross-sectional view of the test structure along the A-A' or B-B' lines of FIG. 3 in accordance with some embodiments of the disclosure.

FIG. 3 is an enlarged top view of a region 150 of the FIG. 2, showing the arrangement of a test structure 106 and a photoresist pattern PR which is used to define source and drain regions of adjacent transistor test units in accordance with some embodiments of the disclosure. FIG. 4 is a cross-sectional view of the test structure 106 along the A-A' or B-B' line of FIG. 3 in accordance with some embodiments of the disclosure. As shown in FIGS. 3 and 4, the semiconductor structure 500 may include a photoresist pattern PR which is used to define the positions of adjacent source and drain regions S1, D2 of adjacent transistor test units UT1, UT2 of the test structure 106 during the source/drain implantation process.

In some embodiment, the test structure 106 includes an active region 108 and the transistor test units UT1 and UT2. The transistor test units UT1 and UT2 are disposed on the substrate 200 and arranged side by side along the direction 300. Each of the transistor test units UT1 and UT2 includes transistor test devices TFT1 and TFT2 arranged sequentially along the direction 300. Therefore, the transistor test device TFT2 of the transistor test unit UT1 may be adjacent to the transistor test device TFT1 of the transistor test unit UT2. In some embodiment, the transistor test devices TFT1 and TFT2 have physical characteristics similar to transistor devices (not shown) fabricated in one of the die areas 104. In addition, the transistor test devices TFT1 and TFT2 and the transistor devices (not shown) in one of the die areas 104 may be formed using the same fabrication processes. In some embodiment, channels of the transistor test devices TFT1 and TFT2 have the same conductivity type. For example, the transistor test devices TFT1 and TFT2 may be N-type or P-type metal-oxide-semiconductor field effect transistors (NMOS FETs or PMOS FETs) having a physical structure similar to NMOS FETs or PMOS FETs in one of the die areas 104. The transistor test devices TFT1 and TFT2 are disposed in the scribe line areas 102 for testing to ensure that the photolithography process and the subsequent implantation process for forming source/drain regions of the die areas 104 do not cause the resulting circuits to fail.

As shown in FIG. 4, one or more isolation features 201, such as shallow trench isolation (STI) features or local oxidation of silicon (LOCOS) features, may be disposed in the substrate 200. In addition, the isolation features 201 may surround the active region 108. In some embodiment, the isolation features 201 are configured to provide physical and electrical isolation between the test structure 106 and other test structure (not shown) in the scribe line area 102 or semiconductor devices (not shown) in the die areas 104.

As shown in FIG. 4, a well region 202 is formed in a portion of the substrate 200 underlying the isolation features 201. The well region 202 may extend from a top surface 200T of the substrate 200 into a portion of the substrate 200. In some embodiment, the well region 202 may have N-type or P-type. The active region 108 may be located in the well region 202. The transistor test units UT1 and UT2 may be formed in the active region 108. In some embodiment, the well region 202 may have a first conductivity type such as P-type, or a second conductivity type such as N-type, depending on requirements.

In some embodiment, the transistor test device TFT1 of the transistor test units UT1 and UT2 includes the well region 202, a gate structure G1, a source doped region S1 and a drain doped region D1.

The gate structure G1 is disposed on the substrate 200 in the active region 108. In addition, the gate structure G1 is formed over the well region 202 and extends along the direction 310. In some embodiment, the gate structure G1 includes a gate dielectric layer 212-1, a gate electrode 214-1 and gate spacers 216-1.

The gate dielectric layer 212-1 is formed on the top surface 200T of the substrate 200. In some embodiments, the gate dielectric layer 212-1 includes silicon oxide, silicon nitride, silicon oxynitride (SiON) or any other applicable dielectric materials.

The gate electrode 214-1 is formed over the gate dielectric layer 212. In some embodiments, the gate electrode 214-1 includes polycrystalline-silicon (poly-Si), polycrystalline silicon-germanium (poly-SiGe) or any other applicable conductive materials. In some embodiments, the gate structure G1 is formed by a deposition process and a subsequent patterning process.

The gate spacers 216-1 are formed on sidewalls of the gate dielectric layer 212-1 and the gate electrode 214-1. In some embodiments, the gate spacers 216-1 includes a dielectric material such as silicon oxide (SiO$_2$), silicon nitride (SiN), silicon carbide (SiC), silicon oxynitride (SiON), silicon carbon nitride (SiCN), silicon oxide carbonitride (SiOCN), or any other applicable dielectric materials. In some embodiments, the gate spacers 216-1 are conformally formed by a deposition process and a subsequent etching back process. The deposition process may be performed to form the dielectric material over a top surface and the sidewalls of the gate dielectric layer 212-1 and the gate electrode 214-1. The deposition process may comprise chemical vapor deposition (CVD), flowable chemical vapor deposition, subatmospheric chemical vapor deposition (SACVD), physical vapor deposition (PVD), atomic layer deposition (ALD), or any other applicable deposition processes. The etching back process may be performed to remove a portion the dielectric material over the top surface of the gate structure G1, thereby exposing the gate electrode 214-1 and form the gate spacers 216-1. The etching back process may comprise wet etching, dry etching or a combination thereof.

The source doped region S1 and the drain doped region D1 are disposed in the substrate 200 and on the well region 202. In addition, the source doped region S1 and the drain doped region D1 are formed on opposite sides of the gate structure G1. In some embodiment, the source doped region S1 and the drain doped region D1 are formed by a photolithography process and a subsequent implantation process.

In some embodiment, the transistor test device TFT2 of the transistor test units UT1 and UT2 may have the same or similar structure to the transistor test device TFT1. For example, the transistor test device TFT2 may includes the well region 202, a gate structure G2, a source doped region S2 and a drain doped region D2.

The gate structure G1 and the gate structure G2 may be arranged sequentially in the direction 300 and extends along the direction 310. In some embodiment, the gate structure G2 includes a gate dielectric layer 212-2, a gate electrode 214-2 and gate spacers 216-2. The gate spacers 216-2 are formed on sidewalls of the gate dielectric layer 212-2 and the gate electrode 214-2. In some embodiment, the gate structure G1 and the gate structure G2 may have the same or similar structure. In some embodiment, the processes and the materials for forming the gate dielectric layer 212-2 may be similar to, or the same as, those for forming the gate dielectric layer 212-1. The processes and the materials for forming the gate electrode 214-2 may be similar to, or the same as, those for forming the gate electrode 214-1. In addition, the processes and the materials for forming the gate spacers 216-2 may be similar to, or the same as, those for forming the gate spacers 216-1.

The source doped region S2 and the drain doped region D2 are disposed in the substrate 200 and on the well region 202. In addition, the source doped region S2 and the drain doped region D2 are formed on opposite sides of the gate structure G2. In some embodiment, the conductivity type of the source doped regions S1, S2 and the drain doped regions S1, S2 is different from the conductivity type of the well region 202. In some embodiment, the source doped region S1 and the source doped region S2 may have the same or similar profile and dopant concentration. In some embodiment, the drain doped region D 1 and the drain doped region D2 may have the same or similar profile and dopant concentration.

In some embodiment, the transistor test devices TFT1 and TFT2 of the transistor test units UT1 and UT2 are connected in series along the direction 300. In each of the transistor test units UT1 and UT2, the drain region D1 of the transistor test device TFT1 is located between the gate structures G1 and G2 of the transistor test unit UT1. In addition, the source region S2 of the transistor test device TFT2 is located between the gate structures G1 and G2 of the transistor test unit UT1 and connected to the drain region D1 of the transistor test device TFT1. In other words, the drain region D1 of the transistor test device TFT1 may be used as the source region S2 of the second transistor test device TFT2 in each of the transistor test units UT1 and UT2.

In some embodiments, the transistor test devices TFT1 and the second transistor test devices TFT2 of the transistor test units UT1 and UT2 of the test structure 106 have the same size, in order to better monitor the drain-source on-resistance (Rdson) difference of the transistor test devices TFT1 and the transistor test devices TFT2. For example, the transistor test devices TFT1 and the transistor test devices TFT2 of the test structure 106 may have the same channel length and the same channel width. In some embodiments, a channel length CL1 of the transistor test devices TFT1 may be the same as a channel length CL2 of the transistor test devices TFT2. For example, a channel width CW1 of the transistor test devices TFT1 may be the same as a channel width CW2 of the transistor test devices TFT2.

In some embodiments, the transistor test device TFT1 and the second transistor test device TFT2 in each of the transistor test units UT1 and UT2 of the test structure 106 may be disposed as close as possible in order to reduce the geometric variances.

As shown in FIGS. 3 and 4, the photoresist pattern PR may be arranged between the gate structure G2 of the transistor test device TFT2 of the transistor test unit UT1 and the gate structure G1 of the transistor test device TFT1 of the transistor test unit UT2 and extends along the direction 310. More specifically, the photoresist pattern PR may be located between the drain region D2 of the transistor test device TFT2 of the transistor test unit UT1 and the source region S1 of the transistor test device TFT1 of the transistor test unit UT2. Opposite edges PS1 and PS2 of the photoresist pattern PR may be adjacent to the drain region D2 of the transistor test device TFT2 of the transistor test unit UT1 and the source region S1 of the transistor test device TFT1 of the transistor test unit UT2, respectively. In other words, the drain region D2 of the transistor test device TFT2 of the transistor test unit UT1 is separated form the source region S1 of the transistor test device TFT1 of the transistor test unit UT2 by the photoresist pattern PR. It is noted that there is no source or drain region formed directly under the photoresist pattern PR.

Since the photoresist pattern PR is used to define the positions of adjacent source and drain regions S1, D2 of adjacent transistor test units UT1, UT2 of the test structure 106 during the source/drain implantation process, a dimension (a lateral dimension) LS1 of the source region S1 of the transistor test device TFT1 of the transistor test unit UT2 along the direction 300 is equal to the distance (the lateral distance) between the photoresist pattern PR and the gate structure G1 of the transistor test device TFT1 of the transistor test unit UT2 along the direction 300. In addition, in the direction 300, a dimension LD2 of the drain region D2 of the transistor test device TFT2 of the transistor test unit UT1 is equal to the distance (the lateral distance) between the photoresist pattern PR and the gate structure G2 of the transistor test device TFT2 of the transistor test unit UT1.

In some embodiments, a first sum of the dimension LS1 and the dimension LD2 of the test structure 106 may have a fixed value. In addition, the first sum of the dimension LS1 and the dimension LD2 of the test structure 106 may be equal to twice the minimum space of an implant region to a channel of a transistor of the design rule. In the normal process for forming the source/drain region without overlay shift or critical dimension (CD) shift issue, the dimension LS1 may be equal to the dimension LD2 and have a normal value (i.e., the dimensions LS1 and LD2 are the same as the minimum space of an implant region to a channel of a transistor of the design rule). When the photoresist pattern PR for forming the source/drain regions has the overlay shift or CD shift issue, the dimension LS1 may be greater than or less than the dimension LD2, or the dimensions LS1 and LD1 may both have abnormal values.

In some embodiments, the first sum of the dimension LS1 and the dimension LD2 is equal to a second sum of the dimension LD2 and a distance LS2 between the gate structure G1 of the transistor test device TFT1 and the gate structure G2 of the transistor test device TFT2 of the transistor test unit UT1 along the direction 300. The distance LS2 may also serve as a dimension LS2 of the drain region D1 of the transistor test device TFT1 of the transistor test unit UT1 or a dimension LS2 source region S2 of the transistor test device TFT2 of the transistor test unit UT1.

In some embodiments, the first sum of the dimension LS1 and the dimension LD2 is equal to a third sum of the dimension LS1 and a distance LD1 between the gate structure G1 of the transistor test device TFT1 and the gate structure G2 of the transistor test device TFT2 of the transistor test unit UT2 along the direction 300. The distance LD1 may also serve as a dimension LD1 of the drain region D1 of the transistor test device TFT1 of the transistor test unit UT2 or a dimension LD1 source region S2 of the transistor test device TFT2 of the transistor test unit UT2.

Figure 5:
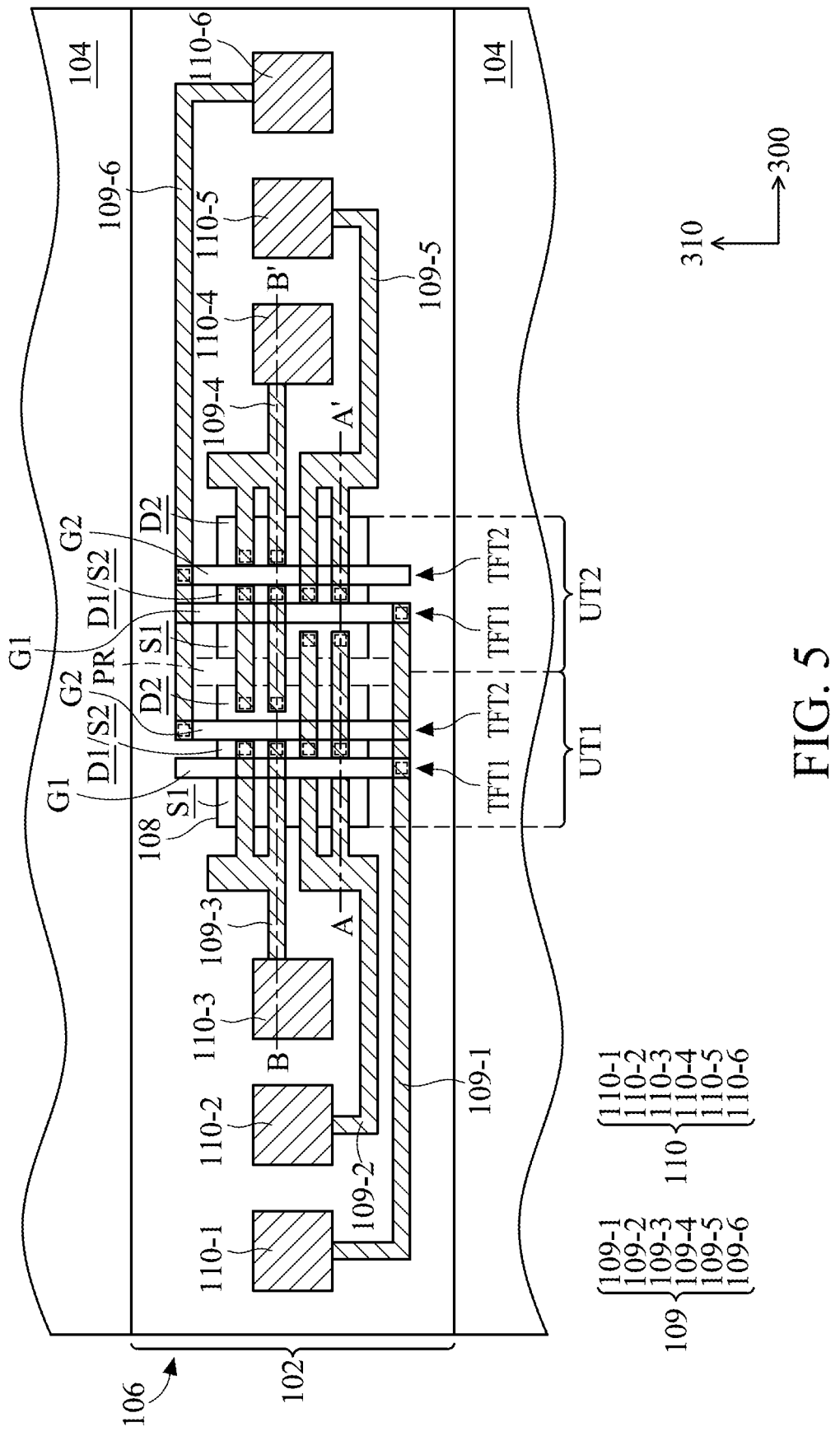
FIG. 5 is an enlarged top view of the FIG. 2, showing the arrangement of test structures in accordance with some embodiments of the disclosure.
Figure 6:
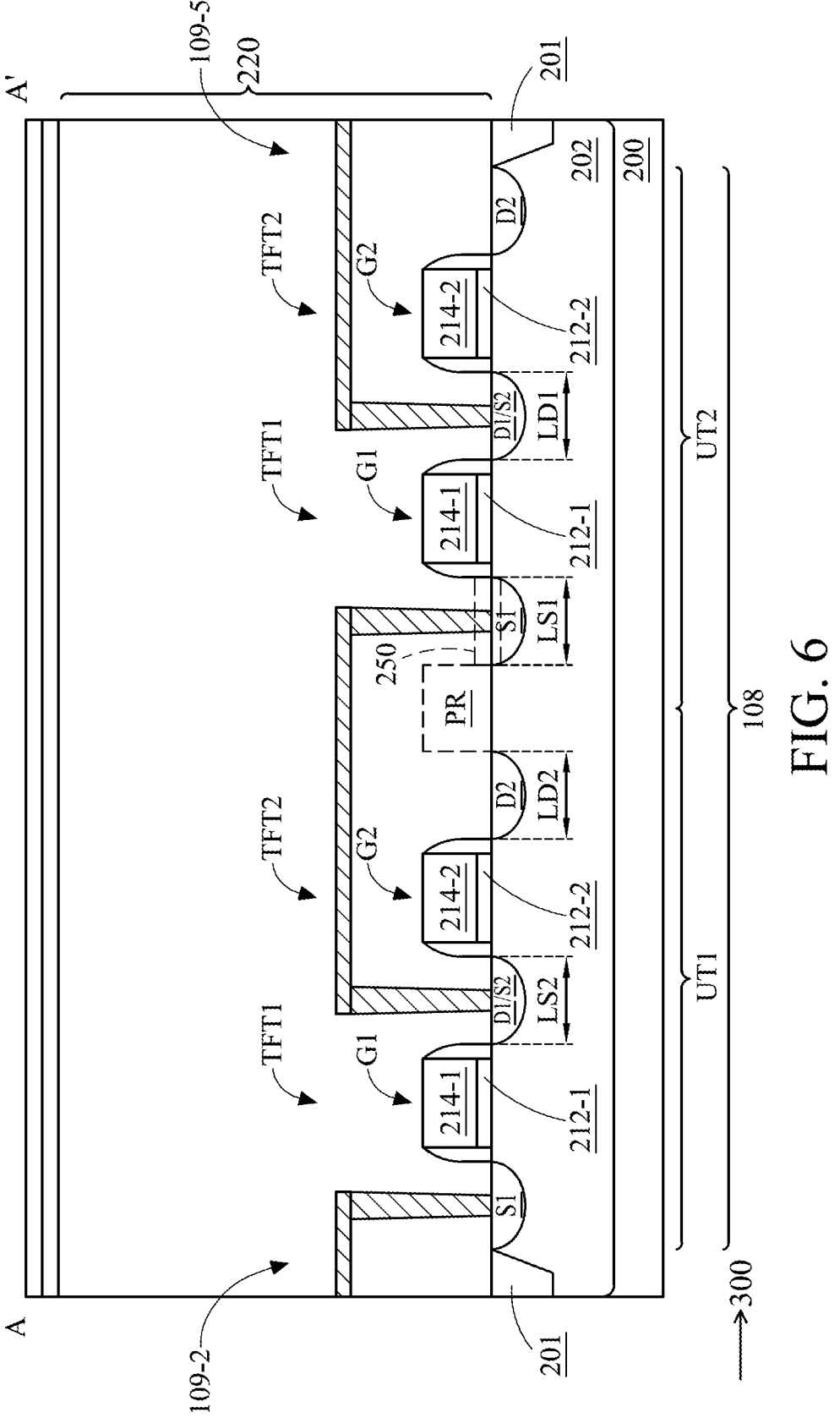
FIG. 6 is a cross-sectional view of the test structure along the A-A' line of FIG. 6 in accordance with some embodiments of the disclosure.
Figure 7:
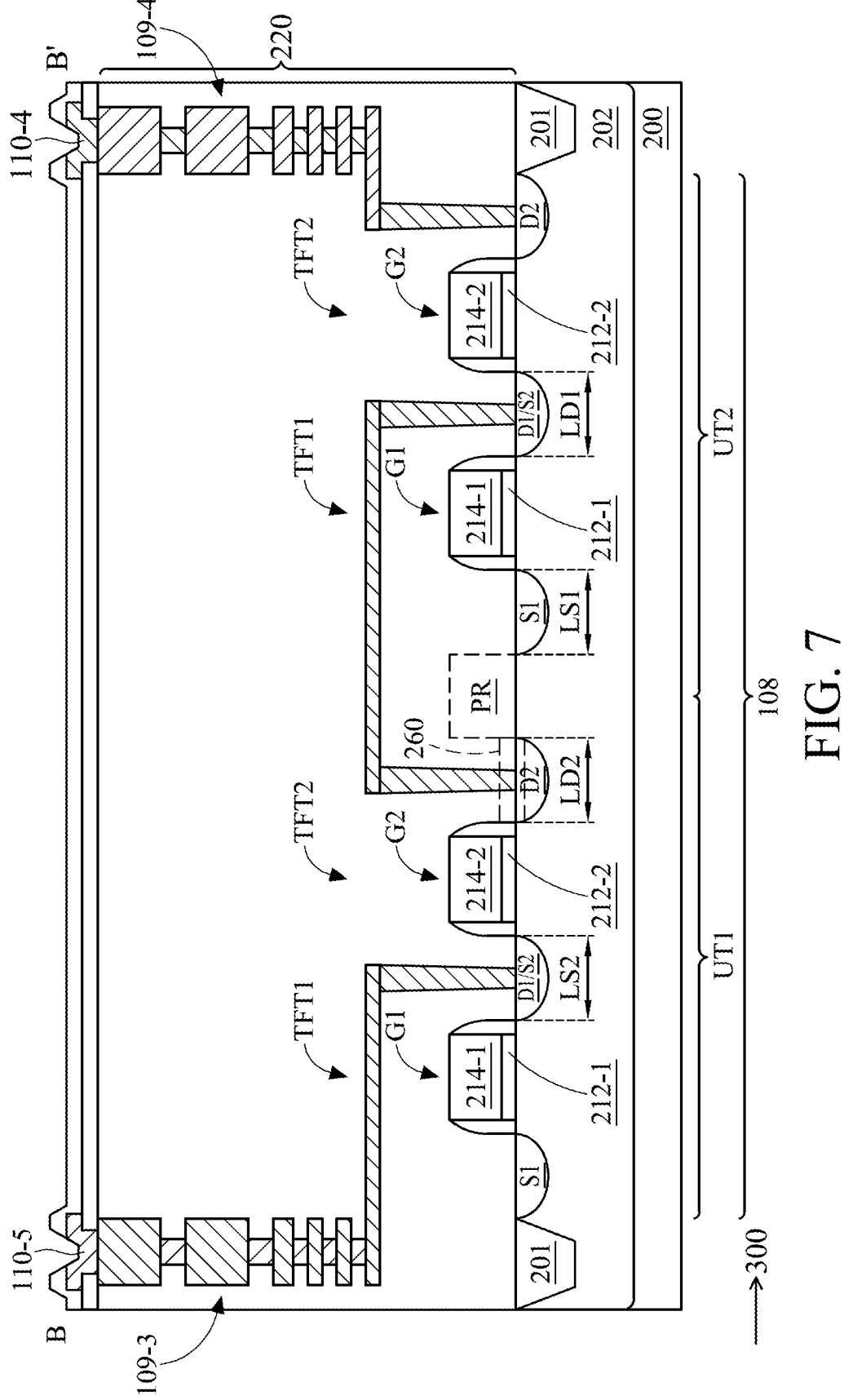
FIG. 7 is a cross-sectional view of the test structure along the B-B' line of FIG. 6 in accordance with some embodiments of the disclosure.

FIG. 5 is an enlarged top view of the region 150 of the FIG. 2. Elements of the embodiments hereinafter, that are the same or similar as those previously described with reference to FIG. 3 are not repeated for brevity. The difference between FIG. 3 and FIG. 5 is that the FIG. 5 further shows the resulting semiconductor structure 500 further including conductive features of an interconnection structure 220 and corresponding test pads 110 (including test pads 110-1, 110-2, 110-3, 110-4, 110-5 and 110-6) of the test structure 106 in accordance with some embodiments of the disclosure. FIG. 6 is a cross-sectional view of the test structure 106 along the A-A' line of FIG. 5 in accordance with some embodiments of the disclosure. FIG. 7 is a cross-sectional view of the test structure 106 along the B-B' line of FIG. 5 in accordance with some embodiments of the disclosure. For illustration of the relationship of the electrical connections between the terminals of the test structure 106 and corresponding test pads 110, portions of the interconnection structure 220 (e.g., interlayer dielectrics (ILD)) between the test structure 106 and the test pads 110 may be hidden to expose portions of the test structure 106 and contacts/vias/conductive traces (drawn in solid lines) of interconnection structure 220 in the side views of FIGS. 6 and 7. In addition, the photoresist pattern PR is drawn in dashed line for illustration of the relationship of the position of the photoresist pattern PR and the electrical performance of the test structure 106.

In some embodiment, the semiconductor structure 500 further includes an interconnection structure 220 formed on the substrate 200 and the test structure 106. In addition, the interconnection structure 220 is configured electrically connected to various terminals of the corresponding test structure 106. In some embodiment, the interconnection structure 220 includes various contacts/vias/conductive traces disposed in multilayer interlayer dielectrics (ILD) (not shown). In some embodiment, the contacts/vias/conductive traces include a conductive material, such as copper (Cu), aluminum (Al), tungsten (W), titanium (Ti), titanium nitride (TiN), tantalum (Ta), tantalum nitride (TaN), or another applicable material. In some embodiment, the interlayer dielectrics may include silicon oxide, silicon oxynitride, un-doped silicate glass (USG), borosilicate glass (BSG), phosphoric silicate glass (PSG), borophosphosilicate glass (BPSG), fluorinated silicate glass (FSG), carbon doped oxide, porous carbon doped silicon dioxide, a polymer such as polyimide or silicon oxycarbide polymer (SiOC), or combinations thereof. The contacts and the vias may be alternately arranged with and electrically connected to the conductive traces belong to various conductive layers of the interconnection structure 220. However, it should be noted that the number of contacts/vias/conductive traces and the number of interlayer dielectrics shown in FIGS. 6 and 7 is only an example and is not a limitation to the present invention.

As shown in FIGS. 5 to 7, conductive traces 109 (including conductive traces 109-1, 109-2, 109-3, 109-4, 109-5 and 109-6) of the interconnection structure 220 may be electrically connected to the corresponding test pads 110 (including the test pads 110-1 to 110-8) of the test structure 106. In addition, the transistor test units UT1 and UT2 are disposed between the corresponding test pads 110 in the direction 300 in the top view, as shown in FIG. 5. The transistor test units UT1 and UT2 are disposed below and electrically connected to the corresponding test pads 110 (FIGS. 5 to 7). In some embodiment, the test pads 110 are portions of a topmost conductive layer of the interconnection structure 220. The test pads 110 are exposed to openings in a passivation layer (not shown). In some embodiment, the test pads 110 includes aluminum (Al) or copper (Cu). However, it should be noted that the number of test pads 110 shown in FIG. 5 is only an example and is not a limitation to the present invention.

In some embodiments, the gate structure G1 and the source doped region S1 of the transistor test device TFT1 of the transistor test unit UT1 and the drain doped region D1 of the transistor test device TFT1 of the transistor test unit UT2 are electrically connected to three different test pads 110 in the scribe line area 102. In addition, the gate structure G2 and the source doped region S2 of the transistor test device TFT2 of the transistor test unit UT1 and the drain doped region D2 of the transistor test device TFT2 of the transistor test unit UT2 are electrically connected to other three different test pads 110 in the scribe line area 102. For example, in the transistor test unit UT1, the gate structure G1 of the transistor test device TFT1 and the source doped region S1 of the transistor test device TFT1 and the source doped region S2 of the transistor test device TFT2 may be electrically connected to the corresponding test pads 110-1, 110-2 and 110-3 by the conductive traces 109-1, 109-2 and 109-3, respectively. For example, in the transistor test unit UT2, the drain doped region D1 of the transistor test device TFT1, the drain doped region D2 of the transistor test device TFT2 and the gate structure G2 of the transistor test device TFT2 may be electrically connected to the corresponding test pads 110-4, 110-5 and 110-6 by the conductive traces 109-4, 109-5 and 109-6, respectively. However, it should be noted that the positions of the test pads 110-1 to 110-6 and the conductive traces 109-1 to 109-6 shown in FIGS. 5 to 7 are only an example and are not limited to the disclosed embodiments.

In some embodiments, the transistor test device TFT1 of the transistor test unit UT1 and the transistor test device TFT1 of the transistor test unit UT2 are in a series connection. In addition, the transistor test device TFT2 of the transistor test unit UT1 and the transistor test device TFT2 of the transistor test unit UT2 are in a series connection. As shown in FIGS. 5 and 6, the gate structure G1 of the transistor test device TFT1 of the transistor test unit UT1 is electrically connected to the gate structure G1 of the transistor test device TFT1 of the transistor test unit UT2 by the conductive trace 109-1. The drain region D1 of the transistor test device TFT1 of the transistor test unit UT1 is electrically connected to the source region S1 of the transistor test device TFT1 of the transistor test unit UT2 by the conductive trace (not shown). As shown in FIGS. 5 and 7, the gate structure G2 of the transistor test device TFT1 of the transistor test unit UT1 is electrically connected to the gate structure G2 of the transistor test device TFT1 of the transistor test unit UT2 by the conductive trace 109-6. The drain region D2 of the transistor test device TFT2 of the transistor test unit UT1 is electrically connected to the source region S2 of the transistor test device TFT2 of the transistor test unit UT2 by the conductive trace (not shown).

According to the electrical connections of the between the terminals of the test structure 106 and corresponding test pads 110, the transistor test devices TFT1 and the transistor test devices TFT2 in the transistor test units UT1 and UT2 may be individually measured for the testing of various physical characteristic variables, such as strain, doping type or concentration, the critical dimension of the devices (such as channel length, channel width, gate oxide thickness), electrical performances (such as threshold voltage, on-state resistance, saturation current or leakage current), or other useful characteristics. It is noted that the relationships of the electrical connections (including the conductive traces 109) between the terminals of the transistor test devices TFT1 and the transistor test devices TFT2 in the transistor test units UT1 and UT2 and the corresponding test pads 110 are not limited to the disclosed embodiment.

As shown in FIGS. 5, 6 and 7, in the test structure 106, the series connected transistor test devices TFT1 of the transistor test units UT1 and UT2 are used to monitor the residue of the photoresist PR on the source region (the left side) of the transistor in the die area 104 during the source/drain implantation process. The series connected transistor test devices TFT2 of the transistor test units UT1 and UT2 are used to monitor the residue of the photoresist PR on the drain region (the right side) of the transistor in the die area 104 during the source/drain implantation process. More specifically, the residue of the photoresist PR on the source region (the left side) or the drain region (the right side) of the transistor in the die area 104 may be monitored by the comparison of the drain-source on-resistance (Rdson) between the series connected transistor test devices TFT1 and the series connected transistor test devices TFT2 of the transistor test units UT1 and UT2.

In some embodiments, the drain-source on-resistance (Rdson) of the transistor test devices TFT1 may be measured by applying the suitable gate voltage (higher than the gate-to-source voltage (VGS) (or the threshold voltage (Vt) of the transistor test device TFT1)) to the pad 110-1 to turn on the transistor test devices TFT1, and applying the drain voltage to the pad 110-4 to measure the drain current (ID) and the drain-to-source voltage (VDS), and calculating through the equation, Rdson=VDS/ID.

In some embodiments, if the photoresist PR does not have overlay shift and CD shift issues, the dimension LS1 and the dimension LD2 may have the same and normal value without any photoresist residue (PR scum), so that the series connected transistor test devices TFT1 and the series connected transistor test devices TFT2 may have the same and normal drain-source on-resistance (Rdson) value.

In some embodiments, if the photoresist PR has overlay shift to the right (e.g., the positive direction 300), the dimension LS1 of the source region S1 may be smaller than the dimension LD2 of the drain region D2. That is to say, the dimension LS1 may be smaller than the minimum space of an implant region to a channel of a transistor of the design rule and result in residue of the photoresist PR on the source region S1 of the transistor test device TFT1 of the transistor test unit UT2 (e.g., the residue of the photoresist PR may be located in a region 250 shown in FIG. 6). Therefore, the drain-source on-resistance (Rdson) of series connected transistor test devices TFT1 may be greater than that of series connected transistor test devices TFT2.

In some embodiments, if the photoresist PR has overlay shift to the left (e.g., the negative direction 300), the dimension LD2 of the drain region D2 may be smaller than the dimension LS1 of the source region S1. That is to say, the dimension LD2 may be smaller than the minimum space of an implant region to a channel of a transistor of the design rule and result in residue of the photoresist PR on the drain region D2 of the transistor test device TFT2 of the transistor test units UT2 (e.g., the residue of the photoresist PR may be located in a region 260 shown in FIG. 7). Therefore, the drain-source on-resistance (Rdson) of the series connected transistor test devices TFT2 may be greater than that of the series connected transistor test devices TFT1.

In some embodiments, if the photoresist PR has CD shift issue resulting in photoresist residue (PR scum), the dimension LS1 and the dimension LD2 may have the same and abnormal low value (e.g., smaller than the minimum space of an implant region to a channel of a transistor of the design rule), so that the series connected transistor test devices TFT1 and the series connected transistor test devices TFT2 may have the same and abnormal high drain-source on-resistance (Rdson) value.

Embodiments provide a semiconductor structure including a test structure disposed in a scribe line area of a semiconductor wafer. The test structure is used to monitor the photoresist residue on the source/drain regions in the die areas by wafer acceptance test (WAT) of electrical performances. In some embodiments, the test structure includes a first transistor test unit and a second transistor test unit disposed on the substrate along a first direction and connected in series. The first transistor test unit and the second transistor test unit each includes first transistor test device and a second transistor test device arranged sequentially in the first direction. The first drain region of the first transistor test device is used as the second source region of the second transistor test device. The first transistor test devices of the first and the second transistor test unit are connected in series, and the second transistor test devices of the first and second transistor test unit are connected in series. A photoresist pattern, which is used to define the positions of the second drain region of the second transistor test device of the first transistor test unit and the first source region of the first transistor test device of the second transistor test unit during the source/drain implantation process, is arranged between the second gate structure of the first transistor test unit and the first gate structure of the second transistor test unit. In some embodiments, the first sum of the first dimension of the first source region of the second transistor test unit and the second dimension of the second drain region of the first transistor test unit along the first direction is equal to the second sum of the third dimension of the first drain region of the first transistor test unit and the fourth dimension of the first drain region of the second transistor test unit along the first direction.

In some embodiments, the series connected first transistor test devices of the first and second transistor test units are used to monitor the photoresist residue of the on the source region (the left side) of the transistor in the die area during the source/drain implantation process. The series connected second transistor test devices of the first and second transistor test units are used to monitor the photoresist residue on the drain region (the right side) of the transistor in the die area during the source/drain implantation process. In some embodiments, the photoresist residue caused by overlay shift or critical dimension (CD) shift issue can be identified by comparing the drain-source on-resistance (Rdson) between the series connected first transistor test devices and the series connected second transistor test devices of the first and second transistor test units rather than visual inspection.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a semiconductor wafer having a substrate having a scribe line area and die areas, wherein the die areas are separated by the scribe line area;
   a test structure disposed in the scribe line area, comprising:
   a first transistor test unit and a second transistor test unit disposed on the substrate and arranged side by side along a first direction, wherein the first transistor test unit and the second transistor test unit each comprises:
   a first gate structure and a second gate structure arranged sequentially in the first direction and extending along a second direction;
   a first source region and a first drain region disposed on opposite sides of the first gate structure; and
   a second source region and a second drain region disposed on opposite sides of the second gate structure; and
   a photoresist pattern arranged between the second gate structure of the first transistor test unit and the first gate structure of the second transistor test unit and extending along the second direction, wherein
   the first gate structure of the first transistor test unit is electrically connected to the first gate structure of the second transistor test unit,
   the second gate structure of the first transistor test unit is electrically connected to the second gate structure of the second transistor test unit,
   the first drain region of the first transistor test unit is electrically connected to the first source region of the second transistor test unit, and
   the second drain region of the first transistor test unit is electrically connected to the second source region of the second transistor test unit.

2. The semiconductor structure as claimed in claim 1, wherein in the first direction, a first dimension of the first source region of the second transistor test unit is equal to a first distance between the photoresist pattern and the first gate structure of the second transistor test unit, a second dimension of the second drain region of the first transistor test unit is equal to a second distance between the photoresist pattern and the second gate structure of the first transistor test unit.

3. The semiconductor structure as claimed in claim 2, wherein a first sum of the first dimension and the second dimension is equal to a second sum of the second dimension and a third distance between the first and second gate structures of the first transistor test unit along the first direction.

4. The semiconductor structure as claimed in claim 2, wherein a first sum of the first dimension and the second dimension is equal to a third sum of the first dimension and a fourth distance between the first and second gate structures of the second transistor test unit along the first direction.

5. The semiconductor structure as claimed in claim 2, wherein a first sum of the first dimension and the second dimension is equal to twice the minimum space of an implant region to a channel of a transistor of the design rule.

6. The semiconductor structure as claimed in claim 1, wherein the photoresist pattern is located between the second drain region of the first transistor test unit and the first source region of the second transistor test unit.

7. The semiconductor structure as claimed in claim 1, wherein the first drain region and the second source region of the first transistor test unit are located between the first and second gate structures of the first transistor test unit and connected to each other, and wherein the first drain region and the second source region of the second transistor test unit are located between the first and second gate structures of the second transistor test unit and connected to each other.

8. The semiconductor structure as claimed in claim 1, wherein the test structure further comprises:
   a first test pad electrically connected to the first gate structure of the first transistor test unit and the first gate structure of the second transistor test unit;
   a second test pad electrically connected to the first source region of the first transistor test unit;
   a third test pad electrically connected the second source region of the first transistor test unit;
   a fourth test pad electrically connected to the first drain region of the second transistor test unit;
   a fifth test pad electrically connected to the second drain region of the second transistor test unit; and
   a sixth test pad electrically connected to the second gate structure of the first transistor test unit and the second gate structure of the second transistor test unit.

9. The semiconductor structure as claimed in claim 1, wherein
   in each of the first transistor test unit and the second transistor test unit, the first gate structure, the first source region and the first drain region form a first transistor test device,
   the second gate structure, the second source region and the second drain region form a second transistor test device, and wherein
   the first transistor test devices of the first and second transistor test units are in a series connection, and
   the second transistor test devices of the first and second transistor test units are in a series connection.

10. The semiconductor structure as claimed in claim 9, wherein when a first drain-source on-resistance of the series connected first transistor test devices is greater than a second drain-source on-resistance of series connected second transistor test devices, the photoresist pattern has a residue on the first source region of the second transistor test unit.

11. The semiconductor structure as claimed in claim 9, wherein when a first drain-source on-resistance of the series connected first transistor test devices is less than a second drain-source on-resistance of series connected second transistor test devices, the photoresist pattern has a residue on the second drain region of the first transistor test unit.

12. A semiconductor structure, comprising:
   a semiconductor wafer having a substrate having a scribe line area and die areas, wherein the die areas are separated by the scribe line area;

a test structure disposed in the scribe line area, comprising:

a first transistor test unit and a second transistor test unit disposed on the substrate along a first direction and connected in series, wherein the first transistor test unit and the second transistor test unit each comprises:

a first transistor test device and a second transistor test device arranged sequentially in the first direction, wherein a first drain region of the first transistor test device is used as a second source region of the second transistor test device; and a photoresist pattern having opposite edges respectively adjacent to a second drain region of the second transistor test device of the first transistor test unit and a first source region of the first transistor test device of the second transistor test unit, wherein a first sum of a first dimension of the first source region of the second transistor test unit and a second dimension of the second drain region of the first transistor test unit along the first direction is equal to a second sum of a third dimension of the second source region of the first transistor test unit and a fourth dimension of the first drain region of the second transistor test unit along the first direction.

13. The semiconductor structure as claimed in claim 12, wherein a first gate structure of the first transistor test device of the first transistor test unit is electrically connected to a first gate structure of the first transistor test device of the second transistor test unit, a second gate structure of the second transistor test device of the first transistor test unit is electrically connected to a second gate structure of the second transistor test device of the second transistor test unit, the first transistor test devices of the first and second transistor test units are in a series connection, and the second transistor test devices of the first and second transistor test units are in a series connection.

14. The semiconductor structure as claimed in claim 13, wherein the test structure further comprises:

a first test pad electrically connected to the first gate structure of the first transistor test unit and the first gate structure of the second transistor test unit;

a second test pad electrically connected to the first source region of the first transistor test unit;

a third test pad electrically connected the second source region of the first transistor test unit;

a fourth test pad electrically connected to the first drain region of the second transistor test unit;

a fifth test pad electrically connected to the second drain region of the second transistor test unit; and a sixth test pad electrically connected to the second gate structure of the first transistor test unit and the second gate structure of the second transistor test unit.

15. The semiconductor structure as claimed in claim 12, wherein the first sum has a fixed value.

16. The semiconductor structure as claimed in claim 13, wherein the first dimension of the first source region of the second transistor test unit along the first direction is equal to a first distance between the photoresist pattern and the first gate structure of the second transistor test unit.

17. The semiconductor structure as claimed in claim 13, wherein the second dimension of the second drain region of the first transistor test unit along the first direction is equal to a second distance between the photoresist pattern and the second gate structure of the first transistor test unit.

18. The semiconductor structure as claimed in claim 13, wherein the first sum of the first dimension and the second dimension is equal to twice a third distance between the first and second gate structures of the first transistor test unit along the first direction.

19. The semiconductor structure as claimed in claim 12, wherein the first sum of the first dimension and the second dimension is equal to twice the minimum space of an implant region to a channel of a transistor of the design rule.

20. The semiconductor structure as claimed in claim 19, wherein when a first drain-source on-resistance of the series connected first transistor test devices is greater than a second drain-source on-resistance of series connected second transistor test devices, the photoresist pattern has a residue on the first source region of the second transistor test unit.

21. The semiconductor structure as claimed in claim 19, wherein when a first drain-source on-resistance of the series connected first transistor test devices is less than a second drain-source on-resistance of series connected second transistor test devices, the photoresist pattern has a residue on the second drain region of the first transistor test unit.

\* \* \* \* \*